US000001218H

United States Statutory Invention Registration [19]

[11] Reg. Number: H1218

Cory et al. [43] Published: Aug. 3, 1993

[54] NMR IMAGING WITH VARYING SPATIAL COUPLING

[76] Inventors: David G. Cory, Billerica, Mass. 01821; Joel B. Miller, 3003 Crest Ave., Cheverly, Md. 20785; Allen N. Garroway, 13404 Kris Run Ct., Fort Washington, Md. 20744

[21] Appl. No.: 818,939

[22] Filed: May 6, 1992

[51] Int. Cl.[5] ..... G01R 33/20

[52] U.S. Cl. ..... 324/309; 324/307

[58] Field of Search ..... 324/309, 307, 311, 312

[56] References Cited

U.S. PATENT DOCUMENTS

| | | | |
|---|---|---|---|
| 4,301,410 | 11/1981 | Wind et al. | 324/321 |
| 4,442,404 | 4/1984 | Bergmann | 324/309 |
| 4,609,872 | 9/1986 | O'Donnell | 324/309 |
| 4,654,593 | 3/1987 | Ackerman | 324/307 |
| 4,947,120 | 8/1990 | Frank | 324/309 |

OTHER PUBLICATIONS

"NMR Imaging of Solids with a Spatially Selective Receiver Coil", *Measurement Science & Technology*, vol. 1, pp. 1338–1342, Nov. 1990; Cory et al.

*Primary Examiner*—Bernarr E. Gregory
*Attorney, Agent, or Firm*—Barry A. Edelberg

[57] ABSTRACT

A method for obtaining a nuclear magnetic resonance image of a sample is performed by first placing the sample in a homogeneous static magnetic field excited with a homogeneous transmitter device. Spin magnetization in the sample is thus initially detected with an inhomogeneous receiver device such that an induced voltage in the receiver device depends on a spatial location of precessing nuclei in the sample. Then, a spatial coupling of the sample and the receiver device is varied and the spin magnetization in the sample is again detected with the inhomogeneous receiver device. The full spatial distribution of the spin density of the sample and hence an image of the sample is then determined with the spin magnetizations detected. Either the sample is moved relative to the receiver device, or the spatial coupling of the receiver device and the sample is electronically altered. Any spin interactions are eliminated by using coherent averaging techniques before the detecting steps. In addition, during the varying step, the spin magnetization is either: left in the transverse plane; stored along the static magnetic field direction; allowed to equilibrate along the static magnetic field direction; or spin locked.

10 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

NMR IMAGING WITH VARYING SPATIAL COUPLING

FIELD OF THE INVENTION

The present invention relates generally to the field of NMR imaging, and more particularly to a method of NMR imaging where a spatial coupling of the sample and receiver device is varied.

BACKGROUND OF THE INVENTION

In prior nuclear magnetic resonance imaging systems, spatial properties were determined by the application of a magnetic field which varied over the sample. Either the magnetic field was caused to be spatially dependent by design or by the addition of gradient coils, or a radio frequency field was employed which varied in space. The spatial distribution of spin density was then determined by either recording the signal strength from a selected region, or by recording the temporal evolution of transverse spin magnetization in a field gradient.

Problems with the above noted approaches are that linewidths and chemical shifts complicate the image process. These complications arise from: rapidly decaying signals due to very broad lines typical of solids; off-resonance effects during radio frequency pulses; and the necessity of differentiating between resonance offset which originate from chemical shifts and the transmitter offset, and resonance offset which originate from the applied magnetic field gradients. An additional problem, particularly for solids, is that these spatially dependent fields cause the line-narrowing sequences to deteriorate across the sample. This limits the spatial resolution of the sequence.

In U.S. Pat. No. 3,789,832 (Damadian) a method for imaging is described in which the spatial localization is achieved by means of a spatially inhomogeneous static magnetic field: the signal is obtained just for those spins in the small homogeneous region of the static field, and this sensitive point is slowly steered throughout the specimen.

In U.S. Pat. No. 4,301,410 (Wind et al.), a method for spin imaging solids using NMR spectroscopy is disclosed. According to the method, the sample is rotated about an axis at a particular angle to the NMR static external magnetic field. A magnetic field gradient with a spatial distribution which is related to the sample spinning axis is synchronously rotated with the sample. Data are then collected while performing a solid state NMR line narrowing step. The phase relation between the sample rotation and the field gradient rotation is then changed on a step-by-step basis to map out an image of the object.

In U.S. Pat. No. 4,609,872 (O'Donnell), a method for nuclear magnetic resonance imaging of fluid flow, particularly for blood flow, is disclosed. The method uses multiple-echo phase-constant sequences of signals both in the magnetic field gradient in the direction in which fluid flow is to be determined and in the radio frequency magnetic field utilized with the magnetic field gradient.

In U.S. Pat. No. 4,654,593 (Ackerman), a method for nuclear magnetic resonance imaging with a nonmagnetic moving object. The object to be analyzed is positioned in a field of a radio frequency excitation coil and a magnetic field of a nuclear resonance spectrometer. The object is of a low conductivity so as to be substantially transparent to electromagnetic radiation at the nuclear magnetic resonance frequency. The nonmagnetic object is subjected to periodic motion while transverse magnetization is generated. At least one phase-encoding magnetic field gradient pulse in at least one specified direction to the moving object, which is of sufficiently short duration so that the object does not move appreciably while the pulse is on, is then applied. The magnetic field gradient is then turned off and a free induct ion decay signal is detected. The steps are then repeated using appropriate increments in the intensities of the field gradient and an appropriate processing of the signals is performed.

In U.S. Pat. No. 4,947,120 (Frank), a method for nuclear magnetic resonance imaging of blood flow is disclosed. Flow induced phase shifts are distinguished from systematic phases produced during image formation, thereby enabling the separation of flowing and stationary components.

A method of solid state NMR imaging of stationary specimens employing pulsed magnetic field gradients and coherent averaging to improve spatial resolution is presented in a patent application (Navy Case Number 72,761) and in J. B. Miller, D. G. Cory, and A. N. Garroway, *Chem. Phys. Lett.*, 164, (1989).

Surface coils for NMR imaging may be designed as aggregates of smaller, non-interacting coils, as shown in P. Mansfield, *J. Phys. D (Appl. Phys.)*, 21, 1643 (1988).

Solid state NMR imaging has been accomplished with an inhomogeneous surface coil and a static sample, as in J. B. Miller and A. N. Garroway, *J. Magn. Reson.* 77, 187 (1988) and also J. B. Miller and A. N. Garroway, *J. Magn. Reson.* 85, 432 (1989).

SUMMARY OF THE INVENTION

In accordance with the present invention, a method for obtaining a nuclear magnetic resonance image of a sample is performed in a manner to avoid the problems associated with the prior art discussed above. First, the sample is placed in a homogeneous static magnetic field and excited with a homogeneous transmitter (coil or equivalent) device. Spin magnetization in the sample is thus initially detected with an inhomogeneous receiver (coil or equivalent) device such that an induced voltage in the receiver device depends on a spatial location of precessing nuclei in the sample. Then, a spatial coupling of the sample and the receiver device is varied and the spin magnetization in the sample is again detected with the inhomogeneous receiver device. The full spatial distribution of the spin density of the sample and hence an image of the sample is then determined with the spin magnetizations detected.

In one embodiment of the invention, the sample is moved relative to the receiver device. In another embodiment, the spatial coupling of the receiver device and the sample is electronically altered.

In a preferred embodiment of the invention, any spin interactions are eliminated by using coherent averaging techniques before the detecting steps. In addition, during the varying step, the spin magnetization is either: left in the transverse plane; stored along the static magnetic field direction; allowed to equilibrate along the static magnetic field direction; or spin locked.

Where the sample has a length l, the moving step preferably includes moving the sample by a distance $\Delta x$. Then, the varying and subsequently detecting steps are repeated $1/\Delta x$ number of times.

In another preferred embodiment which is especially sensitive, the exciting step includes the step of creating a nutation frequency with the transmitter device by applying a sequence of radio frequency pulses. Then, the detecting steps each include the use of an array of DC SQUID (superconducting quantum interference device) detectors which detect the low frequency spin magnetizations along a static magnetic field induced by the exciting step.

It is an advantage of the present invention that there are no spatially dependent fields so that the sample responds uniformly to all NMR experiments. In particular, multiple-pulse line-narrowing schemes will function uniformly across the sample, avoiding a limit to the available resolution in solid state imaging.

It is also an advantage of the present invention that the receiver device has a spatially dependent coupling to the sample.

Other features and advantages of the present invention are stated in or apparent from detailed descriptions of presently preferred embodiments of the invention found hereinbelow.

DETAILED DESCRIPTION OF THE PREFERRED EMBODIMENTS

Figure 1:
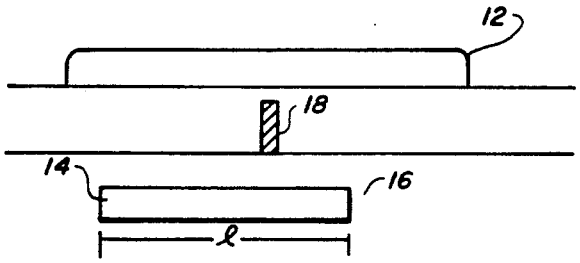
FIG. 1 is a block diagram of an NMR imaging arrangement in accordance with a preferred embodiment of the invention.

The present invention is a method of obtaining a nuclear magnetic resonance image of a sample (liquid or solid) without employing any spatially varying magnetic fields (either static or time varying). This invention has been the subject of the following article: "NMR Imaging of Solids with a Spatially Selective Receiver Coil", *Measurement Science and Technology*, Vol. 1, pp. 1338–1342, Nov. 1990—which is herein incorporated by reference.

In accordance with the present invention, the spatial properties (location of spin magnetization) of the sample are investigated solely by creating a spatially varying coupling of the spin magnetization of the sample to the receiver device of the nuclear magnetic resonance imaging apparatus, generally denoted 10. A separate, homogeneous transmitter device having spatially homogeneous response 12 (i.e., a transmitter device whose magnetic field lines are essentially spatially homogeneous over the extent of the sample) is employed for exciting the spin magnetization of the sample 14 and for possible line-narrowing schemes as appropriate. The sample 14 is placed in a homogeneous static magnetic field 16. The full spatial distribution of the spin density is mapped out by either translating the sample through the receiver device having spatially inhomogeneous response 18 or by electronically altering the spatial coupling of the receiver device having spatially inhomogeneous response 18 and sample 14 (as by forming the receiver device of a number of elements and then selecting one set of elements for one measurement and then a second set for another measurement creating an apparent movement). It will thus be appreciated that this method requires no magnetization gradients of any kind across the sample.

The image analysis may take the form of a deconvolution, Fourier transformation, or Hadamard transformation depending on the details of the data collection. In addition, this method may be used for slice selection where no image analysis is necessary. The method may also be used with an array of SQUID detectors, particularly in a nutation experiment, as discussed subsequently.

The method of the present invention is accomplished in the following manner. Initially, the sample 14 is placed in a homogeneous magnetic field 16. The sample is then excited with a homogeneous transmitter device having spatially inhomogeneous response 12. If desirable, various spin interactions are eliminated using well-known coherent averaging techniques. Such techniques include: Carr-Purcell sequence or modifications thereof; spin-lock; WAHUHA, MREV-8, BR-24, TREV, or MG-8; Lee-Goldburg technique; and MAS (magic angle spinning). The spin magnetization is detected (measured) with an inhomogeneous receiving device having spatially inhomogeneous response 18 such that the induced voltage in the inhomogeneous device depends on the spatial location of the spin.

Next, the sample is displaced by $\Delta x$, and the measurement step is repeated. During this step, the spin magnetization is either: left in the transverse plane; stored along the static magnetic field direction; allowed to equilibrate along the static magnetic field direction; or spin locked. The choice will depend on the time required to displace the sample and on the variation in local fields which the spins experience due to sample displacement. In principle, the receiver device having spatially inhomogeneous response 18 may be shifted while the sample is left stationary, or the spatial dependence of the coupling may be changed electronically.

For a sample of length l, $l/\Delta x = n$ measurements should be made. Then, after all of the measurements, the image is suitably calculated as explained below.

In order to explain the image calculation simply, a one-dimensional image will be discussed. However, it will be appreciated by those of ordinary skill in the art that the calculation technique can easily be extended to two or three dimensions.

The measured one-dimensional signal, $S(m\Delta x)$, is given by the convolution of the receiver device 18 response profile and the sample's spin density. Thus:

$$S(m\Delta x) = \int \rho(x + m\Delta x)\, R(x)\, dx$$

where $\rho(x)$ is the spin density of the sample, $R(x)$ is the response profile of the device, and the integral is evaluated over the entire sample. $\Delta x$ is conveniently expressed as the offset of the center of the sample from the center of the receiver device 18.

To create an image, the above expression must be inverted to recover $\rho(x)$. For this purpose, Heaviside function response profiles lead to particularly simple solution. In general, if a solution exists, it may be obtained by Fourier deconvolution. To accomplish this, the following steps are taken. Initially, the response profile, $R(x)$, is measured—typically using samples 14 whose spin density is known. Then, the measured signal $S(m\Delta x)$, is Fourier transformed with respect to $m\Delta x$.

Next, the response profile of the device, R(x), is Fourier transformed with respect to x. The result of the Fourier transform of $S(m\Delta x)$ is then divided by the result of the Fourier transform of R(x). If necessary, appropriated steps to avoid spikes from noise-generated zeros should also be taken. Finally, the spin density, $\rho(x)$, is given by the inverse Fourier transformation of the divided result of the previous step.

As appreciated by those of ordinary skill in the art, other analyses are also possible.

Figure 2A:
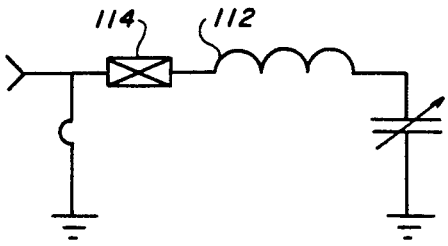
FIGS. 2*a*, 2*b* and 2*c* are schematic diagrams of a probe constructed according to the present invention.
Figure 2B:
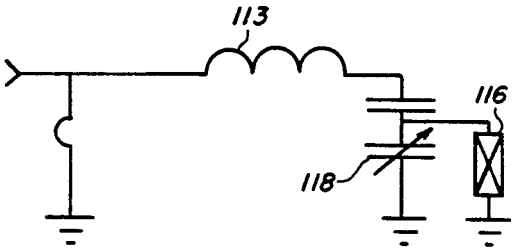
Figure 2C:
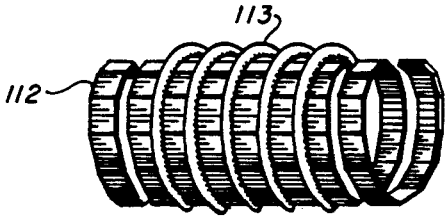

FIGS. 2*a* through 2*c* schematically show the probe. The transmitter coil 112 is an eight turn solenoid wrapped inside the five-loop receiver coil 113, and about the same axis. The two coils 112 and 113 are prevented from interacting by passively switching them with diodes 114 and 116. Series diodes 114 shut off the transmitter coil 112 after the pulse, and diodes 116 in parallel with the receiver tuning capacitor 118 detune the receiver circuitry during the pulse. This is a widely used method of passively switching a receiver and a transmitter coil pair. For simplicity of fabrication, the receiver coil 113 was wound outside the transmitter coil 112, but the opposite configuration is preferred for optimal selectivity and sensitivity.

Figure 3:
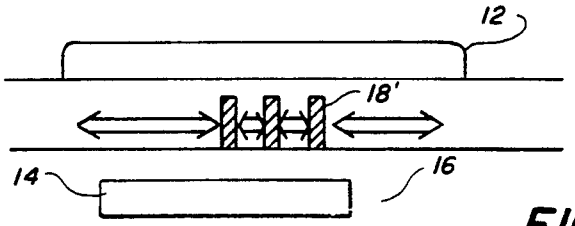
FIG. 3 is a block diagram of an alternative imaging arrangement to that shown in FIG. 1. This Figure is not to scale and the number and position of detector response blocks shown is not intended to be representative of any actual number or position of detector response blocks. For this reason, double-headed arrows (⇄) have been used to show that the number and position of the detector response block shown in FIG. 3 is variable.

As an alternative which is very sensitive for low frequencies, SQUID (superconducting quantum interference device) detection of NMR nutation images is also possible. The embodiment of FIG. 3 is very similar to that of FIG. 1, and like elements have been given the same reference numerals in FIG. 3 with primes attached. In this alternative, NMR imaging utilizes an array of DC SQUID detectors with their associated inhomogeneous responses 18' to record the spin density of a sample. The SQUIDs detect the low frequency spin magnetization along the static magnetic field 16 induced by a nutation sequence. The nutation frequency of the nutation sequence is created by a suitable sequence of radio frequency pulses applied to the sample by a transmitter device having a response 12 which is homogeneous across the sample. The spatial properties are followed by progressively moving the sample 14 past the array of SQUID detectors having inhomogeneous responses 18'. The imaging approaches then follow the techniques discussed above.

Various benefits result from this approach using SQUID detectors. For example, the imaging process does not interfere with line narrowing. Also, enhanced signal-to-noise ratio (and therefor resolution) due to the SQUID's sensitivity is achieved. In achieving this benefit, the importance of retaining a high field for polarizing the sample while at the same time having a low frequency detection system to maintain the SQUID's sensitivity should be noted. Another benefit is that the phased array of small SQUIDs having spatially inhomogeneous responses 18' allows a close approximation of a set of Heaviside functions resulting in a simplified analysis. Still another benefit is that the transmitter device and the SQUID detectors naturally do not interact due to their widely different frequency response.

While the present invention has been described with respect to exemplary embodiments thereof, it will be understood by those of ordinary skill in the art that variations and modifications can be effected within the scope and spirit of the invention.

What is claimed is:

1. A method for obtaining a nuclear magnetic resonance image of a sample comprising the steps of:

placing the sample in a homogeneous static magnetic field;

exciting the sample with a homogeneous transmitter device;

initially detecting spin magnetization in the sample with an inhomogeneous receiver device such that an induced voltage in the receiver device depends on a spatial location of precessing nuclei in the sample;

varying a spatial coupling of the sample and the receiver device;

subsequently detecting spin magnetization in the sample with the inhomogeneous receiver device after varying the spatial coupling; and determining the full spatial distribution of a spin density of the sample and hence an image of the sample with the spin magnetizations detected.

2. A method for obtaining an image as claimed in claim 1 wherein said varying step includes the step of moving the sample relative to the receiver device.

3. A method for obtaining an image as claimed in claim 2 wherein the sample has a length l, said moving step includes moving the sample by a distance $\Delta x$, and said varying and subsequently detecting steps are repeated $1/\Delta x$ number of times.

4. A method for obtaining an image as claimed in claim 2 wherein said exciting step includes the step of creating a nutation frequency with the transmitter device by applying a sequence of radio frequency pulses; and wherein said detecting steps each include the use as the receiver device of an array of DC SQUID detectors having responses which detect the low frequency spin magnetizations along a static magnetic field induced by the said exciting step.

5. A method for obtaining an image as claimed in claim 1 wherein said varying step includes the step of electronically altering the spatial coupling of the receiver device and the sample.

6. A method for obtaining an image as claimed in claim 1 and further including the step of eliminating spin interactions using coherent averaging techniques before the detecting steps.

7. A method for obtaining an image as claimed in claim 1 wherein said varying step includes the step of leaving the magnetization in the transverse plane.

8. A method for obtaining an image as claimed in claim 1 wherein said varying step includes the step of storing the magnetization along the static magnetic field direction.

9. A method for obtaining an image as claimed in claim 1 wherein said varying step includes the step of allowing the magnetization to equilibrate along the static magnetic field direction.

10. A method for obtaining an image as claimed in claim 1 wherein said varying step includes the step of spin locking the magnetization.

* * * * *